United States Patent
Zang et al.

(10) Patent No.: US 10,978,566 B2
(45) Date of Patent: *Apr. 13, 2021

(54) MIDDLE OF LINE STRUCTURES

(71) Applicant: GLOBALFOUNDRIES U.S. INC., Santa Clara, CA (US)

(72) Inventors: Hui Zang, Guilderland, NY (US); Guowei Xu, Ballston Lake, NY (US); Keith Tabakman, Gansevoort, NY (US); Viraj Sardesai, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/742,981

(22) Filed: Jan. 15, 2020

(65) Prior Publication Data

US 2020/0152749 A1  May 14, 2020

Related U.S. Application Data

(63) Continuation of application No. 15/873,565, filed on Jan. 17, 2018, now Pat. No. 10,580,875.

(51) Int. Cl.
*H01L 29/66* (2006.01)
*H01L 29/417* (2006.01)
(Continued)

(52) U.S. Cl.
CPC .. *H01L 29/41775* (2013.01); *H01L 21/28079* (2013.01); *H01L 21/28088* (2013.01);
(Continued)

(58) Field of Classification Search
CPC . H01L 29/66; H01L 29/417; H01L 29/41775; H01L 29/66689; H01L 29/66719; H01L 29/66507; H01L 29/66545; H01L 29/66575; H01L 29/66636; H01L 29/66643; H01L 29/41725; H01L 29/41791; H01L 29/51; H01L 29/518; H01L 29/4983; H01L 29/7839; H01L 29/7845; H01L 29/806; H01L 29/0843; H01L 29/0891;
(Continued)

(56) References Cited

U.S. PATENT DOCUMENTS 5,037,334 A 8/1991 Viselli et al.
5,757,045 A 5/1998 Tsai et al.
(Continued)

OTHER PUBLICATIONS

TW Notice of Allowance dated Jun. 10, 2020 in related TW Application No. 107117560, 4 pages.

*Primary Examiner* — Chuong A Luu
(74) *Attorney, Agent, or Firm* — Francois Pagette; Andrew M. Calderon; Roberts Calderon Safran & Cole, P.C.

(57) ABSTRACT

The present disclosure generally relates to semiconductor structures and, more particularly, to middle of line structures and methods of manufacture. The structure includes: a plurality of gate structures comprising source and/or drain metallization features; spacers on sidewalls of the gate structures and composed of a first material and a second material; and contacts in electrical contact with the source and/or drain metallization features, and separated from the gate structures by the spacers.

18 Claims, 5 Drawing Sheets

(51) Int. Cl.
*H01L 21/28* (2006.01)
*H01L 21/311* (2006.01)
*H01L 21/768* (2006.01)
*H01L 27/088* (2006.01)
*H01L 21/8234* (2006.01)

(52) U.S. Cl.
CPC .. *H01L 21/31144* (2013.01); *H01L 21/76804* (2013.01); *H01L 21/76816* (2013.01); *H01L 21/76831* (2013.01); *H01L 27/088* (2013.01); *H01L 29/66545* (2013.01); *H01L 29/66575* (2013.01); *H01L 21/823468* (2013.01)

(58) Field of Classification Search
CPC ..... H01L 27/088; H01L 23/485; H01L 21/28; H01L 21/311; H01L 21/768; H01L 21/7682; H01L 21/8234; H01L 21/31144; H01L 21/28079; H01L 21/28088; H01L 21/76804; H01L 21/76816; H01L 21/76831; H01L 21/76883; H01L 21/76897; H01L 21/76865; H01L 21/823468; H01L 21/823418; H01L 21/823425; H01L 21/823814; H01L 21/823864; H01L 21/2815; H01L 21/28132

USPC ........................................................ 257/774
See application file for complete search history.

(56) References Cited

U.S. PATENT DOCUMENTS

| | | | |
|---|---|---|---|
| 8,026,172 | B2 | 9/2011 | Wang et al. |
| 8,085,895 | B2 | 12/2011 | Song et al. |
| 8,455,952 | B2* | 6/2013 | Lin ................. H01L 21/823418 257/288 |
| 9,627,510 | B1* | 4/2017 | Jagannathan ..... H01L 29/66545 |
| 10,580,875 | B2* | 3/2020 | Zang ................. H01L 21/76831 |
| 2007/0281461 | A1 | 12/2007 | Jang |
| 2012/0032275 | A1* | 2/2012 | Haran ............... H01L 21/76829 257/401 |
| 2013/0087862 | A1* | 4/2013 | Oosuka .................. H01L 23/535 257/384 |
| 2014/0065783 | A1* | 3/2014 | Chudzik ............. H01L 29/6656 438/303 |
| 2014/0203365 | A1 | 7/2014 | Boos et al. |
| 2015/0187905 | A1 | 7/2015 | Cai et al. |
| 2015/0255571 | A1 | 9/2015 | Xu et al. |
| 2016/0315008 | A1 | 10/2016 | Tung et al. |

* cited by examiner

MIDDLE OF LINE STRUCTURES

FIELD OF THE INVENTION

The present disclosure generally relates to semiconductor structures and, more particularly, to middle of line structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate back end of line (BEOL) and middle of line (MOL) metallization features, e.g., interconnects, due to the critical dimension (CD) scaling and process capabilities, as well as materials that are used to fabricate such structures.

For example, to manufacture interconnect structures for source and drain contacts, it is necessary to remove dielectric material which is adjacent to the gate structures. The removal of the dielectric material is provided by an etching process, which also tends to erode the spacer material of the gate structure. That is, the low-k dielectric material used for the spacer or sidewalls of the gate structure can be eroded away in the downstream etching processes used to form the openings for the drain and source contacts. This loss of material will expose the metal material of the gate structure, resulting in a short between the metal material of the gate structure and the metal material used to form the contact, itself.

SUMMARY

In an aspect of the disclosure, a structure comprises: a plurality of gate structures comprising source and/or drain metallization features; spacers on sidewalls of the gate structures and composed of a first material and a second material; and contacts in electrical contact with the source and/or drain metallization features, and separated from the gate structures by the spacers.

In an aspect of the disclosure, a structure comprises: a plurality of gate structures comprising source/drain regions, gate material, sidewall spacers and a capping material on the gate material and the sidewall spacers; a plurality of source/drain contacts in electrical contact with the source/drain regions; a lining comprised of a top material and a bottom material along the sidewall spacers; and contacts extending to the source/drain contacts and separated from the gate metal by the lining.

In an aspect of the disclosure, a method comprises: forming a plurality of gate structures comprising source and/or drain metallization features; forming spacers on sidewalls of the gate structures comprising a first material and a second material; and forming contacts in electrical contact with the source and/or drain metallization features, and separated from the gate structures by the spacer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to middle of line structures and methods of manufacture. In embodiments, the processes and structures provided herein use spacers on the sides of gate structures to prevent shorting of source/drain (S/D) contacts with metallization of the gate structures. Advantageously, the spacers will provide additional material to prevent shorts from occurring during fabrication processes, i.e., during formation of interconnect structures for the source/drain contacts. The structures provided herein also provide gate structures with improved low parasitic capacitance.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
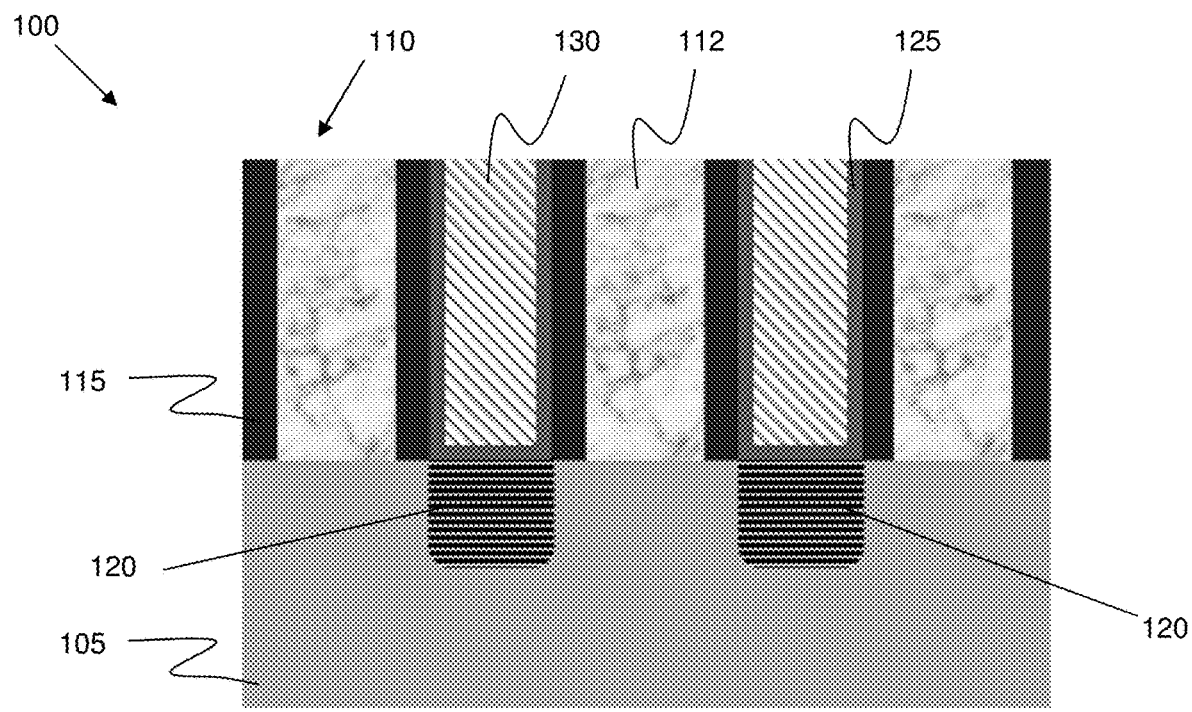
FIG. 1 shows gate structures, amongst other features, and respective fabrication processes in accordance with aspects of the present disclosure.

FIG. 1 shows an incoming structure and respective fabrication processes in accordance with aspects of the present disclosure. More specifically, FIG. 1 shows a structure 100 comprising a substrate 105 composed of a suitable semiconductor material. For example, the substrate 105 may be composed of any suitable material including, but not limited to, Si, SiGe, SiGeC, SiC, GaAs, InAs, InP, etc. In embodiments, the substrate 105 can be representative of a fin structure or a planar feature.

In embodiments, a fin structure can be fabricated using a sidewall image transfer (SIT) technique. In an example of a SIT technique, a mandrel material, e.g., $SiO_2$, is deposited on the substrate 105 using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions of the fin structures. Spacers are formed on the sidewalls of the mandrels which are preferably material that is different than the mandrels, and which are formed using conventional deposition processes known to those of skill in the art. The spacers can have a width which matches the dimensions of the narrow fin structures, for example. The mandrels are removed or stripped using a conventional etching process, selective to the mandrel material. An etching is then performed within the spacing of the spacers to form the sub-lithographic features. The sidewall spacers can then be stripped.

Still referring to FIG. 1, gate structures 110 are formed on the substrate 105. As should be understood, the gate structures 110 can be planar gate structures or finFET gate structures. In either scenario, the gate structures 110 can be fabricated using any known gate formation processes, e.g., replacement gate fabrication processes or gate first processes as is known in the art. In embodiments, the gate structures 110 include gate dielectric material and metallization features. The gate dielectric material can be, e.g., a high-k gate dielectric material, e.g., hafnium based dielectrics. In further embodiments, the high-k dielectric materials can include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The metallization features, i.e., the gate material 112, can include any workfunction metal or any combination of metals, depending on the particular application and design parameters. For example, in embodiments, the gate material 112 can be a tungsten (W) material.

Still referring to FIG. 1, sidewall spacers 115, e.g., a low-k dielectric, can be deposited on the sidewalls of the gate structures 110. The sidewall spacers 115 can be deposited by conventional chemical vapor deposition (CVD) processes followed by a patterning process, e.g., anisotropic etching process, to remove any material from horizontal surfaces of the structure. Source and drain regions (S/D) regions 120 can be formed on sides of the gate structures 110, e.g., sides of the sidewall spacers 115, in the substrate 105 using, e.g., any conventional method. For example, the S/D regions 120 can be formed by an ion implantation process, doping process or through a diffusion processes, as is well known to those of skill in the art such that no further explanation is required for an understanding of the present disclosure. In further embodiments, the S/D regions 120 can be raised S/D regions formed by an epi growth on the surfaces of the substrate 105, between the gate structures 110.

FIG. 1 further shows a liner 125 and insulator material 130 deposited within trenches formed between the gate structures 110 and, more specifically, between the sidewall spacers 115. In embodiments, the liner 125 and the insulator material 130 can be deposited by CVD processes. The liner 125 can be composed of any suitable material, e.g., SiN, while the insulator material can be composed of oxide, for example.

Figure 2:
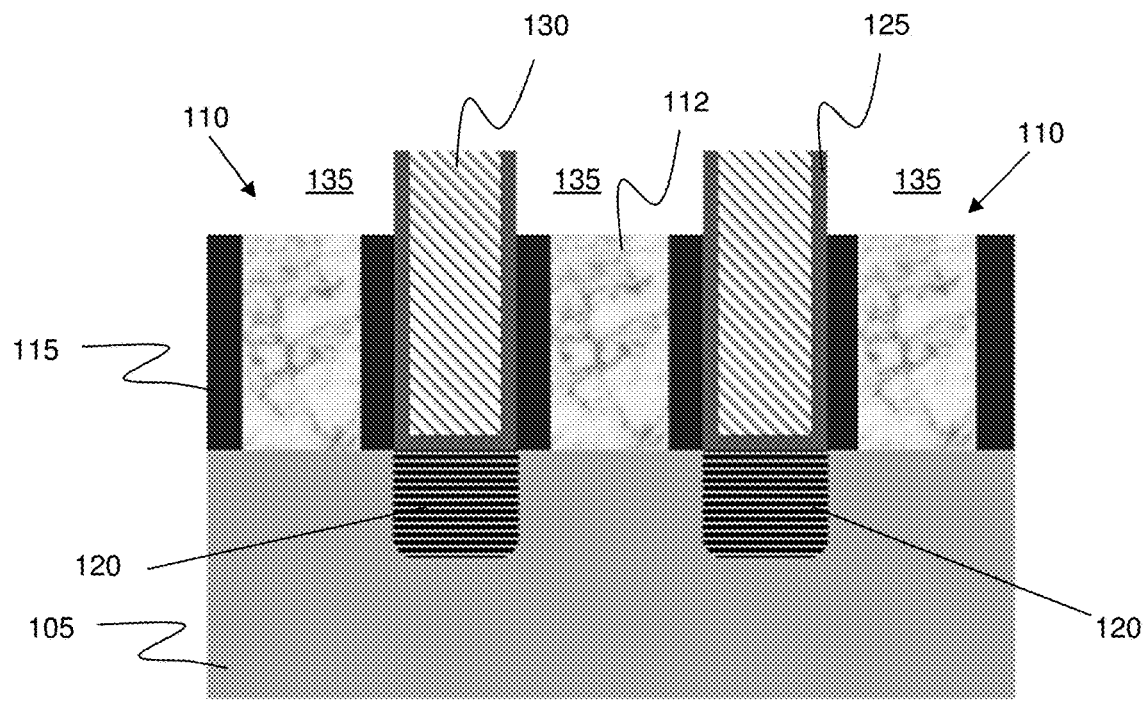
FIG. 2 shows recessed gate material of the gate structures, amongst other features, and respective fabrication processes in accordance with aspects of the present disclosure.

In FIG. 2, recesses 135 are formed by etching back of the gate structures 110. Specifically, the recesses 135 are formed by etching the metallization features, i.e., the gate material 112, of the gate structures 110, followed by the etching of the sidewall spacers 115. In embodiments, the gate material 112 and the sidewall spacers 115 are recessed to below a surface of the liner 125 and the insulator material 130. By way of example, the gate structures 110 can be etched about 10-50% of the original height, e.g., about 30 nm to 40 nm. In embodiments, the gate material 112 and the sidewall spacers 115 can be etched using a reactive ion etching (RIE) with chemistries that are selective to the particular materials of such structures. Advantageously, the etching processes do not require a mask due to the selective chemistries.

Figure 3:
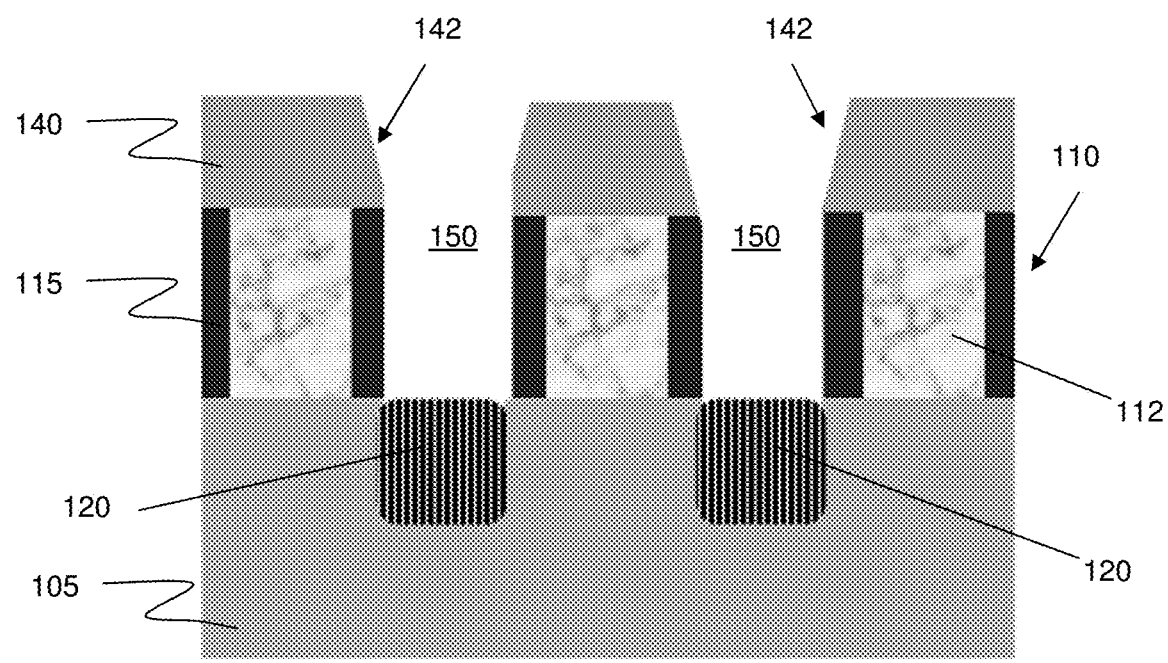
FIG. 3 shows capping material on the recessed gate materials, amongst other features, and respective fabrication processes in accordance with aspects of the present disclosure.

In FIG. 3, a capping material 140 is formed as a layer over the gate structures 110 and the sidewall spacers 115, e.g., in the recesses 135. In this way, the gate structures 110 can comprise a gate material 112, sidewall spacers 115 and the capping material 140. In embodiments, the capping material 140 can be deposited by a CVD process within the recesses 135, followed by a chemical mechanical polishing (CMP) process. As should be understood, the capping material 140 will provide protection to the metallization features of the gate structures 110 during subsequent source/drain contact or interconnect formation, e.g., etching processes to form the source/drain contacts or interconnects. The capping material 140 can be comprised of SiN, for example.

Still referring to FIG. 3, trenches 150 are formed between the gate structures 110 by removal of the liner 125 and the insulator material 130. In embodiments, the liner 125 and the insulator material 130 can be removed by conventional RIE processes. The etching or removal of the liner 125 and the insulator material 130 will expose the S/D regions 120, as well as form a taper 142 of the capping material 140.

Figure 4:
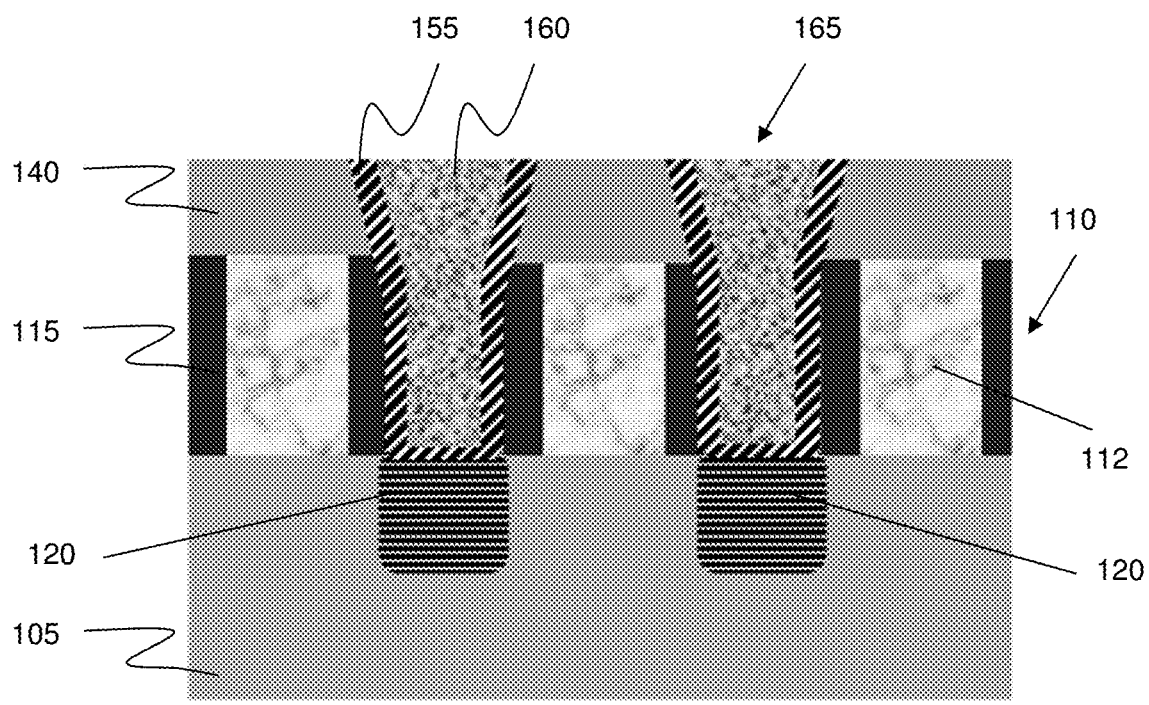
FIG. 4 shows source/drain metallization features (contacts), amongst other features, and respective fabrication processes in accordance with aspects of the present disclosure.

FIG. 4 shows source/drain metallization features, amongst other features, and respective fabrication processes in accordance with aspects of the present disclosure. Specifically, a liner 155 is deposited on the sidewalls of the sidewall spacers 115 using, e.g., physical vapor deposition (PVD) or CVD processes. The liner 155 can be Ti, TiN, TaN, Ru and Co, amongst other examples. In embodiments, the liner 155 can have a thickness in a range of about 2 nm to 20 nm, with a desired thickness in a range of about 8 nm to 10 nm; although other dimensions are contemplated herein. In embodiments, the liner 155 will also contact directly the S/D regions 120 (silicide of the S/D regions). Following the deposition of the liner 155, a metal fill 160 is deposited within the trenches 150 and over the liner 155 to form the source and/or drain metallization features 165. In this way, the plurality of gate structures 110 can comprise the source and/or drain metallization features 165. The metal fill 160 can be deposited by CVD processes, and can be any suitable conductive material. For example, the metal fill 160 can be T, Co, or Cu, for example. In this way, the source and/or drain metallization features 165 comprise a conductive fill material, i.e., the metal fill 160, which is in electrical contact with the S/D regions 120 of the gate structures 110.

Figure 5:
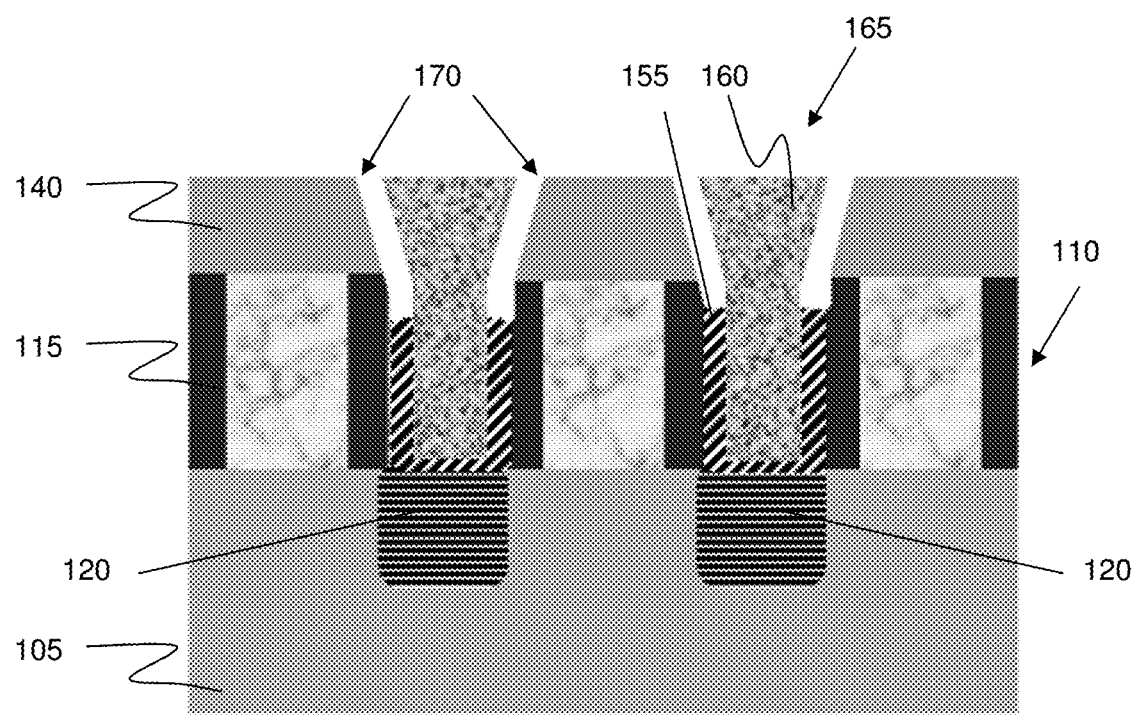
FIG. 5 shows recessed liner material, amongst other features, and respective fabrication processes in accordance with aspects of the present disclosure.

In FIG. 5, portions of the liner 155 are removed from the source and/or drain metallization features 165 to form recesses 170 between the metal fill 160 and the capping material 140. In embodiments, the liner 155 can be recessed by a wet etch process which uses chemistries to remove the material of the liner 155 (selective to the remaining materials), e.g., Ti, TiN, TaN, Ru and Co, etc. In embodiments, the recesses 170 can be of various depths. For example, a depth of the recesses 170 can extend below a surface of the gate structure 110, e.g., below the capping material 140 or a surface of the metal material, i.e., the gate material 112, of the gate structures 110. In embodiments, the recesses 170 can also be within the extent of the capping material 140.

Figure 6:
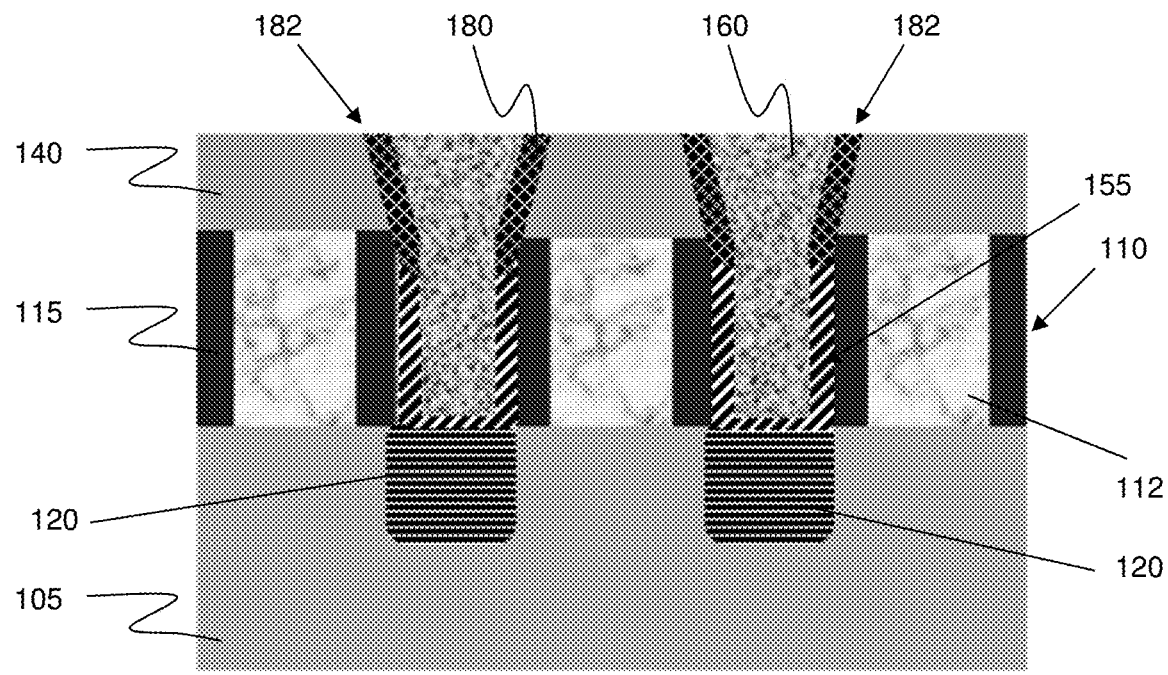
FIG. 6 shows spacer material in the recesses of the liner material, amongst other features, and respective fabrication processes in accordance with aspects of the present disclosure.

In FIG. 6, a spacer material 180 is deposited within the recesses 170 to form spacers 182. In embodiments, the spacer material 180 is different than the material of the liner 155, preferably a more robust material which can better withstand downstream etching processes. For example, the second material or the top material, i.e., the spacer material 180, can be a high-k dielectric material or a low-k dielectric material, with a thickness similar to that of the liner 155, e.g., 2 nm to 20 nm. More specifically, the spacer material 180 can be SiN, $Al_2O_3$ or $HfO_2$, amongst other examples. In this way, the second or the top material is one of SiN, $Al_2O_3$ and $HfO_2$ and the first or the bottom material is one of Ti, TiN, TaN, Ru or Co. The spacer material 180 can be deposited by a conventional CVD process to fill the recesses 170, followed by a CMP process or other etching processes, e.g., etch back, wet etch, or dry etch processes.

In embodiments, the spacer material 180 and the corresponding spacers 182 will serve to further prevent exposure of the gate structures 110 during subsequent MOL etching processes. Specifically, the spacer material 180 will effectively prevent etching processes from exposing the gate metals, i.e., the gate material 112, of the gate structures 110, thereby preventing shorts from occurring between the gate metals and the source/drain contacts or other metallization features, e.g., interconnects, formed during MOL processes. As shown in FIG. 6, the liner material 155 and the spacer material 180 can serve as spacers on the sidewall spacers 115 of the gate structures 110, and can be composed of a first material, which is the liner 155, and a second material, which is the spacer material 180. Alternatively, the liner material 155 together with the spacer material 180 can be considered a lining, with the lining comprised of a top material, i.e., the spacer material 180, and a bottom material, i.e., the liner material 155, along the sidewall spacers 115. In embodiments, the spacers 182 formed from the spacer material 180 are in direct contact with the sidewall spacers 115 and the capping material 140 on the gate structures 110 and the source and/or drain metallization features 165.

Figure 7:
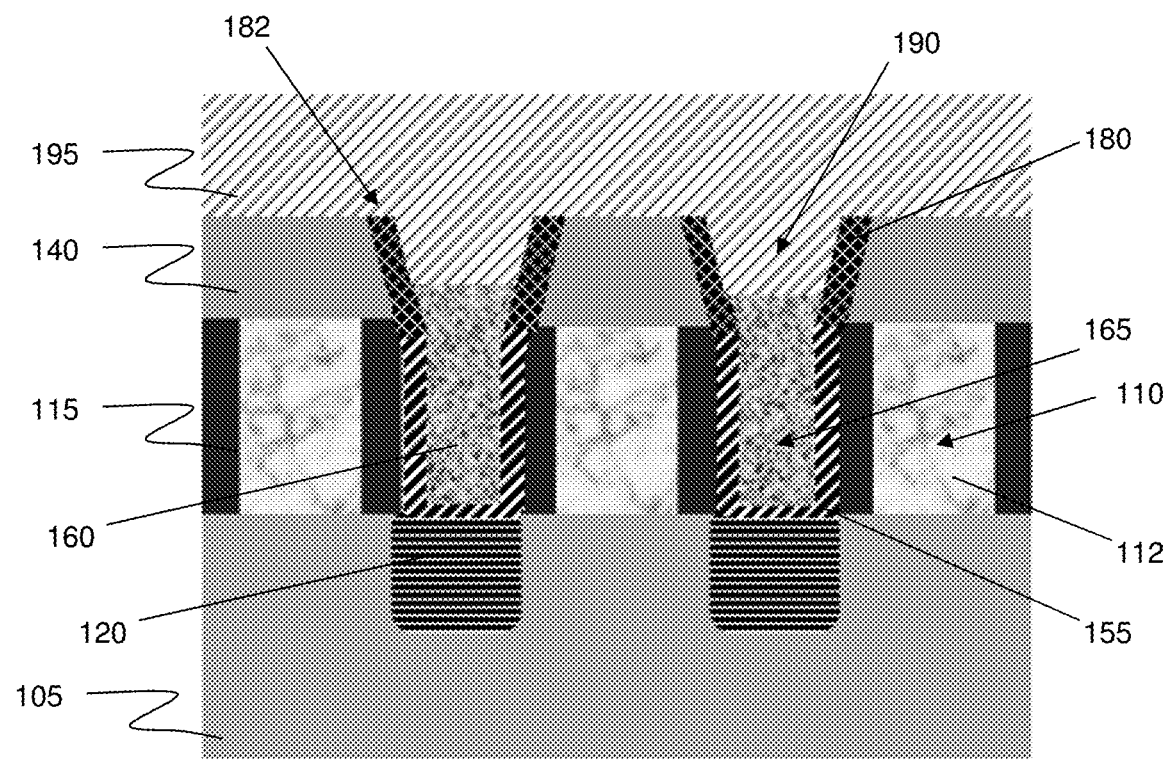
FIG. 7 shows an insulator layer formed in recesses of the source/drain metallization features, amongst other features, and respective fabrication processes in accordance with aspects of the present disclosure.

FIG. 7 shows insulator material 195 formed in recesses 190 of the source and/or drain metallization features 165, amongst other features. More specifically, the metal fill 160 is subjected to a selective etch process to form recesses 190 between the spacer material 180, leaving the spacers 182 formed of the spacer material 180 intact. In embodiments, the recesses 190 will have a depth that is within the extent of the spacers 182, e.g., preferably above the metallization features, i.e., the gate material 112, of the gate structures 110. In this way, by maintaining the depth of the recesses 190 within the extent of the spacers 182 formed of the spacer material 180, the spacers 182 will particularly be able to protect against erosion of the capping material 140 during subsequent etching process. That is, the second material or the top material, i.e., the spacer material 180, protects the layer of capping material 140 from erosion during an etching process. An insulator material 195 can be deposited within the recesses 190. The insulator material 195 can be an interlevel dielectric material, e.g., oxide, deposited by a CVD process.

Figure 8:
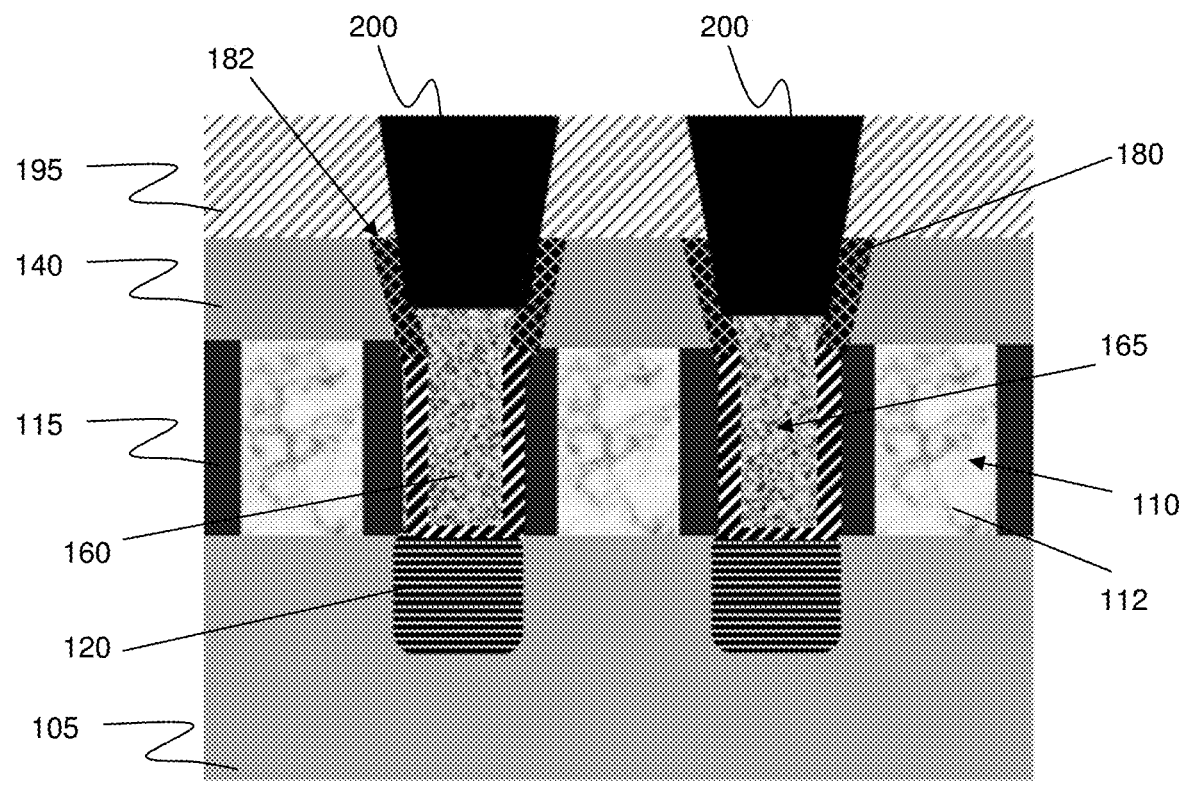
FIG. 8 shows contacts electrically connected to the source/drain metallization features, amongst other features, and respective fabrication processes in accordance with aspects of the present disclosure.

In FIG. 8, metallization structures 200 are formed in the insulator material 195 and act as contacts in direct electrical contact with the metal fill 160 of the S/D regions 120. Specifically, the metallization structures 200 are contacts in electrical contact with the source and/or drain metallization features 165, and are separated from the gate structures 110 by the spacer material 180. In this way, the contacts, i.e., the metallization structures 200, extend to the S/D regions 120 and are separated from the gate material 112 by the lining formed by the liner material 155 and the spacer material 180. In embodiments, the metallization structures 200 can be interconnect structures composed of a tungsten material that is in electrical contact with the S/D regions 120 (via the metal fill 160). The metallization structures 200, e.g., wiring structures or interconnect structures, can be formed by conventional lithography, etching and deposition methods known to those of skill in the art.

The metallization structures 200 can be fabricated by forming a resist over the insulator material 195, which is exposed to energy (light) to form a pattern (opening). An etching process with a selective chemistry, e.g., RIE, will be used to form one or more trenches in the insulator material 195 through the openings of the resist. As should be understood, the spacer material 180 will prevent the etching process from exposing the materials of the gate structures 110; that is, the spacer material 180 will provide protection during the etching process such that the capping material 140 and/or sidewall spacer 115 and/or the gate material 112 will not be subjected to any (or little) erosion during the etching process. As a result, the conductive material deposited for the metallization structures 200 will not contact the metal material, i.e., the gate material 112, of the gate structures 110. In this way, shorting is prevented.

In embodiments, the resist can be removed by a conventional oxygen ashing process or other known stripants, followed by the deposition of the conductive material by conventional deposition processes, e.g., CVD processes. Any residual conductive material on the surface of the insulator material 195 can be removed by conventional chemical mechanical polishing (CMP) processes.

Figure 9:
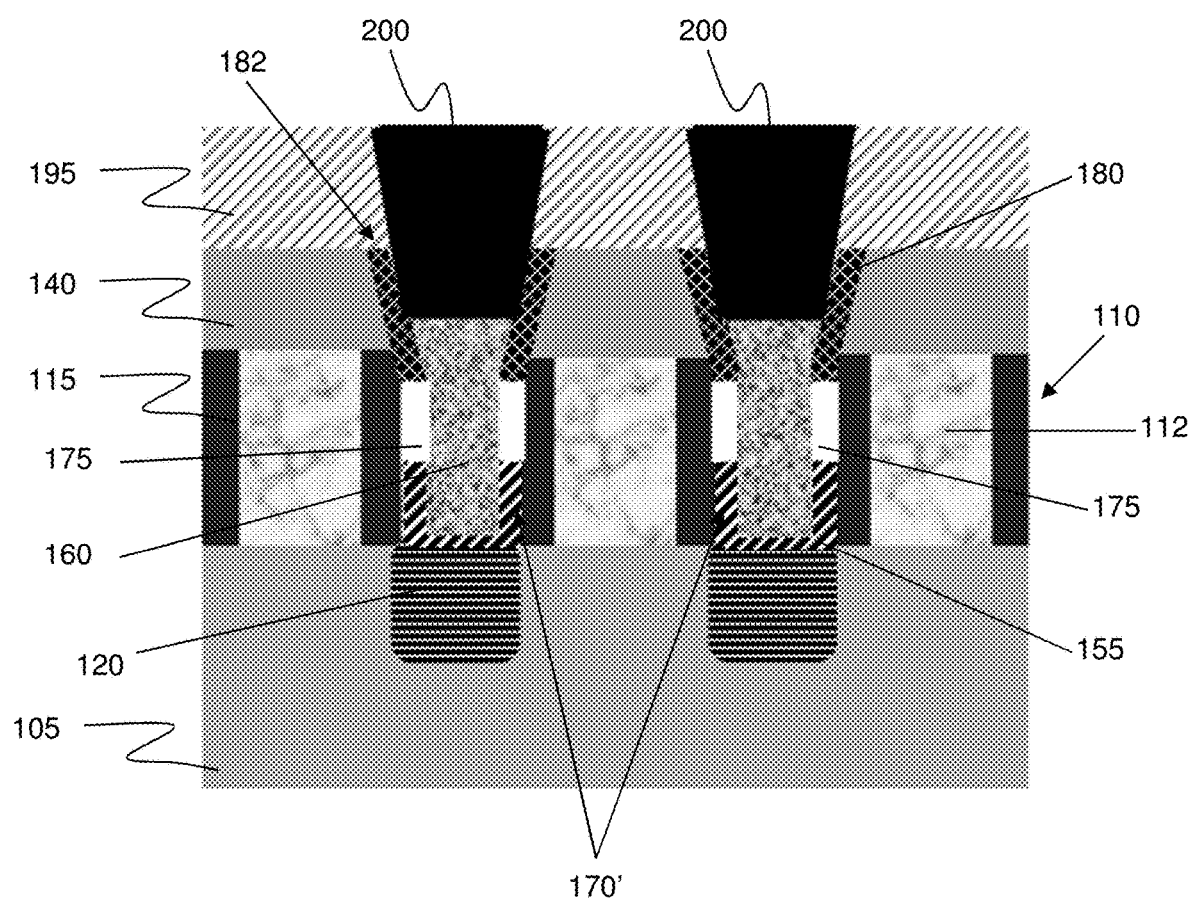
FIG. 9 shows an alternative structure and respective fabrication processes in accordance with additional aspects of the present disclosure.

FIG. 9 shows an alternative structure 100' and respective fabrication processes in accordance with additional aspects of the present disclosure. In FIG. 9, for example, the liner 155 is recessed to below the capping material 140 and, even more specifically, to significantly below a surface of the metallization feature of the gate structures 110, i.e., the gate material 112, as shown by reference numeral 170'. In embodiments, the recesses 170' will be at such a depth that an air gap 175 will be formed in subsequent deposition processes of spacer material 180 due to a pinch-off phenomena; that is, the combination of the depth and width of recesses 170', e.g., aspect ratio of the recesses 170', will result in the formation of air gaps 175 between the sidewall spacers 115 and the metal fill 160 during the deposition of the spacer material 180 due to a pinch-off phenomenon. In this way, the air gaps 175 are between the first or bottom material, i.e., the liner 155, and the second or top material, i.e., the spacer material 180. Further, the air gaps 175 are below a surface of the gate material 112 of the gate structures 110 and are separated from the gate material 112 by the sidewall spacers 115. Specifically, the air gaps 175 are adjacent to the sidewall spacers 115 on the gate structures 110 and below the capping material 140 over the gate material 112. In embodiments, the air gaps 175 will serve to increase the parasitic capacitance of the structure. The remaining portions of the structure 100' are similar to that already described herein.

It should now be understood that the processes and resultant structures described herein will serve to further protect the gate metal of the gate structure during MOL processes. The resultant structures, e.g., sidewall structures, will hence prevent shorts occurring from occurring with interconnect or other wiring structures of the source/drain regions. Accordingly, the processes and structures described herein will increase yield.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of gate structures each comprising a gate material and source and/or drain metallization features;
   spacers on sidewalls of the gate structures and composed of a first material and a second material; and
   a plurality of sidewall spacers in direct contact with both sidewalls of the gate material,
   wherein the first material directly contacts a sidewall of at least one sidewall spacer of the sidewall spacers and directly contacts both sidewalls of a conductive fill material of the source and/or drain metallization features, and
   the first material directly contacts an entire bottom surface of the source and/or drain metallization features.

2. The structure of claim 1, further comprising a tapered capping layer over the gate structures and the sidewall spacers, wherein the second material protects the tapered capping layer from erosion during an etching process.

3. The structure of claim 2, wherein the second material is a high-k dielectric material or a low-k dielectric material.

4. The structure of claim 3, wherein the second material is one of SiN, $Al_2O_3$ and $HfO_2$.

5. The structure of claim 4, wherein the first material is Ti, TiN, TaN, Ru or Co.

6. The structure of claim 5, wherein the conductive fill material is in electrical contact with source and drain regions of the gate structures.

7. The structure of claim 5, wherein the spacers are in direct contact with a sidewall structure and the tapered capping layer on the gate structures and the source and/or drain metallization features.

8. The structure of claim 1, further comprising air gaps between the first material and the second material.

9. The structure of claim 8, wherein the air gaps are below a surface of the gate material of the gate structures.

10. The structure of claim 9, wherein the air gaps are adjacent to the sidewall spacers on the gate structures and below the tapered capping layer over the gate material.

11. The structure of claim 1, further comprising contacts in electrical contact with the source and/or drain metallization features and an airgap between a top surface of the first material and a bottom surface of the second material, wherein the top surface of the first material is below a top surface of the gate material, and the contacts are in direct contact with sidewalls of the second material and a bottom surface of the contacts are in direct contact with a top surface of the conductive fill material within the source and/or drain metallization features.

12. The structure of claim 11, wherein the contacts comprise interconnect structures which comprise a tungsten material that is in electrical contact with the source and/or drain metallization features.

13. The structure of claim 12, wherein the second material is recessed below a tapered capping layer over the gate structures and the sidewall spacers.

14. The structure of claim 1, wherein the spacers are a different material from the plurality of sidewall spacers.

15. The structure of claim 14, wherein the spacers directly contact the plurality of sidewall spacers.

16. The structure of claim 15, wherein the first material directly contacts a top surface of source and drain regions of the gate structures.

17. A structure, comprising:
   a plurality of gate structures each comprising a gate material and source and/or drain metallization features;
   spacers on sidewalls of the gate structures and composed of a first material and a second material; and
   a plurality of sidewall spacers in direct contact with both sidewalls of the gate material,
   wherein the first material directly contacts a sidewall of at least one sidewall spacer of the sidewall spacers and directly contacts both sidewalls of a conductive fill material of the source and/or drain metallization features, and
   the first material directly contacts a bottom surface of the source and/or drain metallization features.

18. The structure of claim 17, further comprising air gaps between the first material and the second material, and the air gaps are below a surface of the gate material of the gate structures.

* * * * *